(12) United States Patent
Kwon et al.

(10) Patent No.: US 9,928,902 B2
(45) Date of Patent: Mar. 27, 2018

(54) METHODS OF OPERATING STORAGE DEVICES

(71) Applicant: SAMSUNG ELECTRONICS CO., LTD., Suwon-si, Gyeonggi-Do (KR)

(72) Inventors: Joon-Soo Kwon, Seoul (KR); Seung-Cheol Han, Suwon-si (KR); Sang-Won Hwang, Suwon-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/378,397

(22) Filed: Dec. 14, 2016

(65) Prior Publication Data

US 2017/0169883 A1 Jun. 15, 2017

(30) Foreign Application Priority Data

Dec. 15, 2015 (KR) ........................ 10-2015-0179099

(51) Int. Cl.
| | |
|---|---|
| G11C 16/04 | (2006.01) |
| G11C 11/56 | (2006.01) |
| G06F 3/06 | (2006.01) |
| G11C 16/10 | (2006.01) |
| G11C 16/16 | (2006.01) |
| G11C 16/28 | (2006.01) |
| G11C 16/34 | (2006.01) |

(52) U.S. Cl.
CPC .......... *G11C 11/5628* (2013.01); *G06F 3/064* (2013.01); *G06F 3/0608* (2013.01); *G06F 3/0652* (2013.01); *G06F 3/0679* (2013.01); *G11C 11/5635* (2013.01); *G11C 11/5642* (2013.01); *G11C 16/0483* (2013.01); *G11C 16/10* (2013.01); *G11C 16/16* (2013.01); *G11C 16/28* (2013.01); *G11C 16/3445* (2013.01); *G11C 16/3459* (2013.01)

(58) Field of Classification Search
CPC ...... G06F 3/0608; G06F 3/064; G06F 3/0652; G06F 3/0629
See application file for complete search history.

(56) References Cited

U.S. PATENT DOCUMENTS

| | | | |
|---|---|---|---|
| 5,822,252 | A | 10/1998 | Lee et al. |
| 5,930,174 | A | 7/1999 | Chen et al. |
| 6,442,071 | B2 | 8/2002 | Choi |
| 6,452,836 | B1 | 9/2002 | Roohparvar |
| 7,324,386 | B2 | 1/2008 | Lin |
| 7,924,610 | B2 | 4/2011 | Chen et al. |
| 9,001,576 | B2 | 4/2015 | Hong |
| 9,378,137 | B2 * | 6/2016 | Kim ................... G06F 12/0246 |
| 9,646,704 | B2 * | 5/2017 | Moon ................... G11C 16/14 |

(Continued)

*Primary Examiner* — Pho M Luu
(74) *Attorney, Agent, or Firm* — P. Chau & Associates, LLC

(57) ABSTRACT

In a method of operating a storage device including at least one nonvolatile memory device and a memory controller configured to control the at least one nonvolatile memory device, a boundary page of a first memory block among a plurality of memory blocks included in the at least one nonvolatile memory device is searched for, at least one clean page, in which data is not written, of the first memory block is searched for, a dummy program operation is performed on a portion of the boundary page and the at least one clean page, and an erase operation is performed on the first memory block.

19 Claims, 19 Drawing Sheets

(56) References Cited

U.S. PATENT DOCUMENTS

| | | | |
|---|---|---|---|
| 9,659,658 B2* | 5/2017 | Kim | ............... G11C 16/0483 |
| 2015/0052394 A1 | 2/2015 | Sunwoo et al. | |
| 2015/0078095 A1 | 3/2015 | Park et al. | |

* cited by examiner

METHODS OF OPERATING STORAGE DEVICES

CROSS-REFERENCE TO RELATED APPLICATION

This U.S. application claims priority under 35 U.S.C. § 119 to Korean Patent Application No. 10-2015-0179099, filed on Dec. 15, 2015, in the Korean Intellectual Property Office, the disclosure of which is incorporated by reference herein in its entirety.

TECHNICAL FIELD

Exemplary embodiments of the inventive concept relate to storage devices and more particularly to methods of operating storage devices.

DISCUSSION OF RELATED ART

Semiconductor memory devices may be classified as volatile semiconductor memory devices or nonvolatile semiconductor memory devices. Volatile semiconductor memory devices may perform read and write operations at high speed. However, volatile semiconductor memory devices lose data stored therein in the absence of power. On the other hand, nonvolatile semiconductor memory devices retain data stored therein in the absence of power.

Examples of nonvolatile semiconductor memory devices may include a mask read-only memory (MROM), a programmable ROM (PROM), an erasable programmable ROM (EPROM), an electrically erasable programmable ROM (EEPROM), etc.

SUMMARY

According to an exemplary embodiment of the inventive concept, a method of operating a storage device including at least one nonvolatile memory device and a memory controller configured to control the at least one nonvolatile memory device is provided. A boundary page of a first memory block among a plurality of memory blocks included in the at least one nonvolatile memory device is searched for. At least one clean page, in which data is not written, of the first memory block is searched for. A dummy program operation is performed on a portion of the boundary page and the at least one clean page. An erase operation is performed on the first memory block.

According to an exemplary embodiment of the inventive concept, a method of operating a storage device including at least one nonvolatile memory device and a memory controller configured to control the at least one nonvolatile memory device is provided. An initial clean word-line, in which data is not written, among a first memory block of a plurality of memory blocks in the at least one nonvolatile memory device after a sudden power-off is searched for. The sudden power-off is an event during which power supplied to the at least nonvolatile memory device ceases. A dummy program operation is selectively performed on a clean page. The clean page is a page coupled to the initial clean word-line.

According to an exemplary embodiment of the inventive concept, a storage device includes a memory controller including a dummy program determinator and a nonvolatile memory device including a memory cell array. The memory controller is configured to control the nonvolatile memory device. The memory cell array includes a plurality of memory blocks. The dummy program determinator searches for a boundary page among a plurality of pages of a first memory block among the plurality of memory blocks and determines whether to perform a dummy program operation on a portion of the boundary page and at least one clean page.

BRIEF DESCRIPTION OF THE DRAWINGS

The above and other features of the inventive concept will be more clearly understood by describing in detail exemplary embodiments thereof with reference with reference to the accompanying drawings.

DETAILED DESCRIPTION OF THE EMBODIMENTS

A storage device including a nonvolatile memory device according to exemplary embodiments of the inventive concept may prevent a deep erase, in which a memory block is continuously erased, by performing an erase operation on the memory block after performing a dummy program operation on a portion of the memory block.

A nonvolatile memory device according to an exemplary embodiment of the inventive concept may be a NAND flash memory, a vertical NAND flash memory (VNAND), a NOR flash memory, a resistive random access memory (RRAM), a phase-change RAM (PRAM), a magnetoresistive RAM (MRAM), a Spin Transfer Torque RAM (STT-RAM), or the like. In addition, the nonvolatile memory device may have a three-dimensional array structure. Exemplary embodiments of the inventive concept are applicable to not only a flash memory device where a charge storage layer is formed of a floating gate, but also a charge trap flash (CTF) memory where a charge storage layer is formed of an insulation film. Below, it is assumed that a nonvolatile memory device is a NAND flash memory device.

Figure 1:
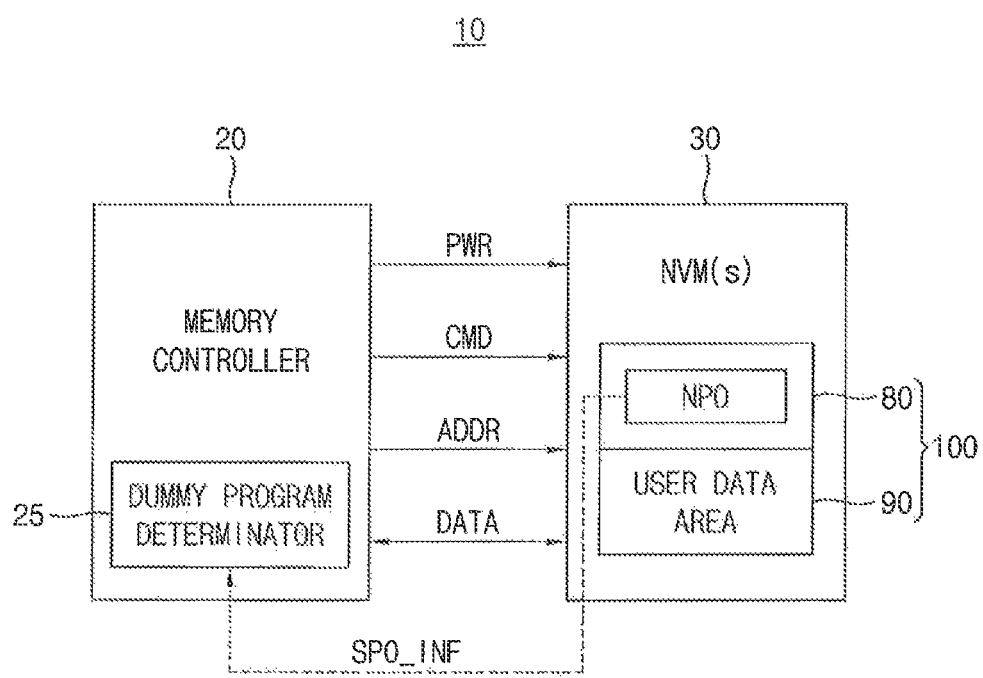
FIG. 1 is a block diagram illustrating a storage device according to an exemplary embodiment of the inventive concept.

FIG. 1 is a block diagram illustrating a storage device according to an exemplary embodiment of the inventive concept.

Referring to FIG. 1, a storage device 10 may include a memory controller 20 and at least one nonvolatile memory device 30.

The storage device 10 may include flash memory based data storage media such as a memory card, a universal serial bus (USB) memory, or a solid state drive (SSD).

The nonvolatile memory device 30 may perform an erase operation, a program operation, or a write operation under control of the memory controller 20. The nonvolatile memory device 30 may receive a command CMD, an address ADDR, and data DATA signals through input/output lines from the memory controller 20 for performing such operations. In addition, the nonvolatile memory device 30 may receive a power PWR signal through a power line from the memory controller 20. The command CMD may include a command latch enable (CLE), an address latch enable (ALE), a chip enable (CE/), a write enable (WE/), or a read enable (RE/).

The nonvolatile memory device 30 may include a memory cell array 100. The memory cell array 100 may include a meta area 80 that stores management information for managing the nonvolatile memory device 30 and a user data area 90 that stores user data. The user data area 90 may include a plurality of memory blocks.

The meta area 80 may be formed of at least one memory block having the same structure as that of each of the memory blocks in the user data area 90. However, the inventive concept is not limited thereto and the meta area 80 memory blocks may be different from those of the user data area 90. The meta area 80 may store power information indicating normal power-off NPO. Here, the power information may be stored in a particular location of the meta area 80 in response to a power-off notification issued from a host.

According to an exemplary embodiment of the inventive concept, the nonvolatile memory device 30 may be booted based on the stored power information.

According to exemplary embodiments of the inventive concept, a sudden power-off information SPO_INF may be obtained based on the stored power information in the meta area 80. For example, it is assumed that the nonvolatile memory device 30 is powered off. In this case, if the stored power information does not indicate normal power-off NPO, the nonvolatile memory device 30 may be treated to as suddenly powered off, as indicated by the sudden power-off information SPO_INF.

The memory controller 20 may determine whether to perform a dummy program operation based on the power information, and may perform the dummy program operation on at least one page of the nonvolatile memory device 30. The memory controller 20 may include a dummy program determinator 25.

The dummy program determinator 25 may determine whether the nonvolatile memory device 30 is suddenly powered off, based on the sudden power-off information SPO_INF read from the meta area 80. As a consequence of determining that the nonvolatile memory device 30 is suddenly powered off, the dummy program determinator 25 may search for a boundary page on which a normal program operation was being performed at sudden power-off. If the boundary page is found, the dummy program determinator 25 may determine whether the dummy program operation on the boundary page is required.

When it is determined that the dummy program operation is to be performed, the memory controller 20 may transmit an address corresponding to the boundary page to the nonvolatile memory device 30. The memory controller 20 may also transmit dummy program data to the nonvolatile memory device 30 along with the address.

General storage devices immediately perform an erase operation on a memory block that was being programmed at sudden power-off. Therefore, even if the memory block has a lot of clean pages in which data is not written, the memory block is nonetheless erased. As a result, lifetime of the memory block is reduced.

However, the storage device 10 according to an exemplary embodiment of the inventive concept searches for a boundary page of a memory block at sudden power-off, checks a clean page, selectively performs a dummy program operation on the boundary page and the clean page, and performs the erase operation on the memory block. Therefore, deep erase of the memory block is prevented and thus the lifetime of the memory block may be extended.

Figure 2:
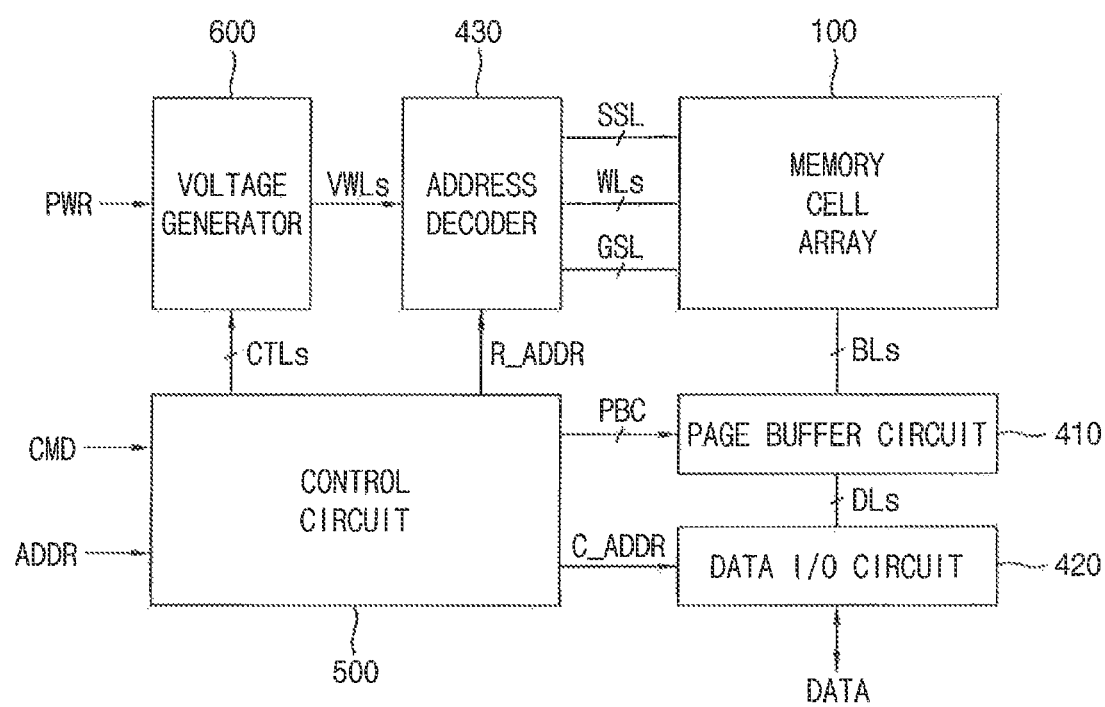
FIG. 2 is a block diagram illustrating the nonvolatile memory device in the storage device of FIG. 1 according to an exemplary embodiment of the inventive concept.

FIG. 2 is a block diagram illustrating the nonvolatile memory device in the storage device of FIG. 1 according to an exemplary embodiment of the inventive concept.

Referring to FIG. 2, the nonvolatile memory device 30 includes a memory cell array 100, an address decoder 430, a page buffer circuit 410, a data input/output circuit 420, a control circuit 500 and a voltage generator 600.

The memory cell array 100 may be coupled to the address decoder 430 through a at least one string selection line SSL, a plurality of word-lines WLs, and at least one ground selection line GSL. In addition, the memory cell array 100 may be coupled to the page buffer circuit 410 through a plurality of bit-lines BLs.

The memory cell array 100 may include a plurality of memory cells coupled to the plurality of word-lines WLs and the plurality of bit-lines BLs.

According to exemplary embodiments of the inventive concept, the memory cell array 100 may be a three-dimensional memory cell array, which is formed on a substrate in a three-dimensional structure (or a vertical structure). In this case, the memory cell array 100 may include vertical cell strings that are vertically oriented such that at least one memory cell is located over another memory cell. The following patent documents, which are hereby incorporated by reference in their entireties, describe suitable configurations of three-dimensional memory cell arrays: U.S. Pat. Nos. 7,679,133; 8,553,466; 8,654,587; 8,559,235; and U.S. Pat. Pub. No. 2011/0233648.

According to exemplary embodiments of the inventive concept, the memory cell array 100 may be a two-dimensional memory cell array, which is formed on a substrate in a two-dimensional structure (or a horizontal structure).

Figure 3:
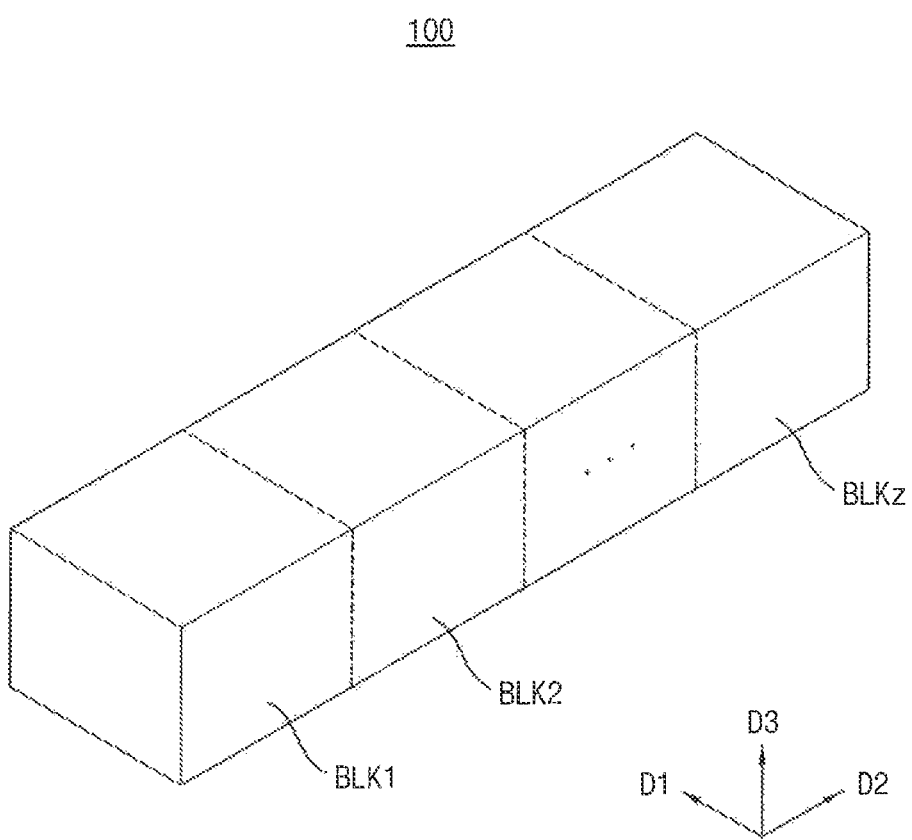
FIG. 3 is a block diagram illustrating a memory cell array in FIG. 2 according to an exemplary embodiment of the inventive concept.

FIG. 3 is a block diagram illustrating the memory cell array in FIG. 2 according to an exemplary embodiment of the inventive concept.

Referring to FIG. 3, the memory cell array 100 may include a plurality of memory blocks BLK1 to BLKz. According to an exemplary embodiment of the inventive concept, the memory blocks BLK1 to BLKz are selected by the address decoder 430 in FIG. 2. For example, the address decoder 430 may select a memory block BLK, among the memory blocks BLK1 to BLKz, corresponding to a block address.

Figure 4:
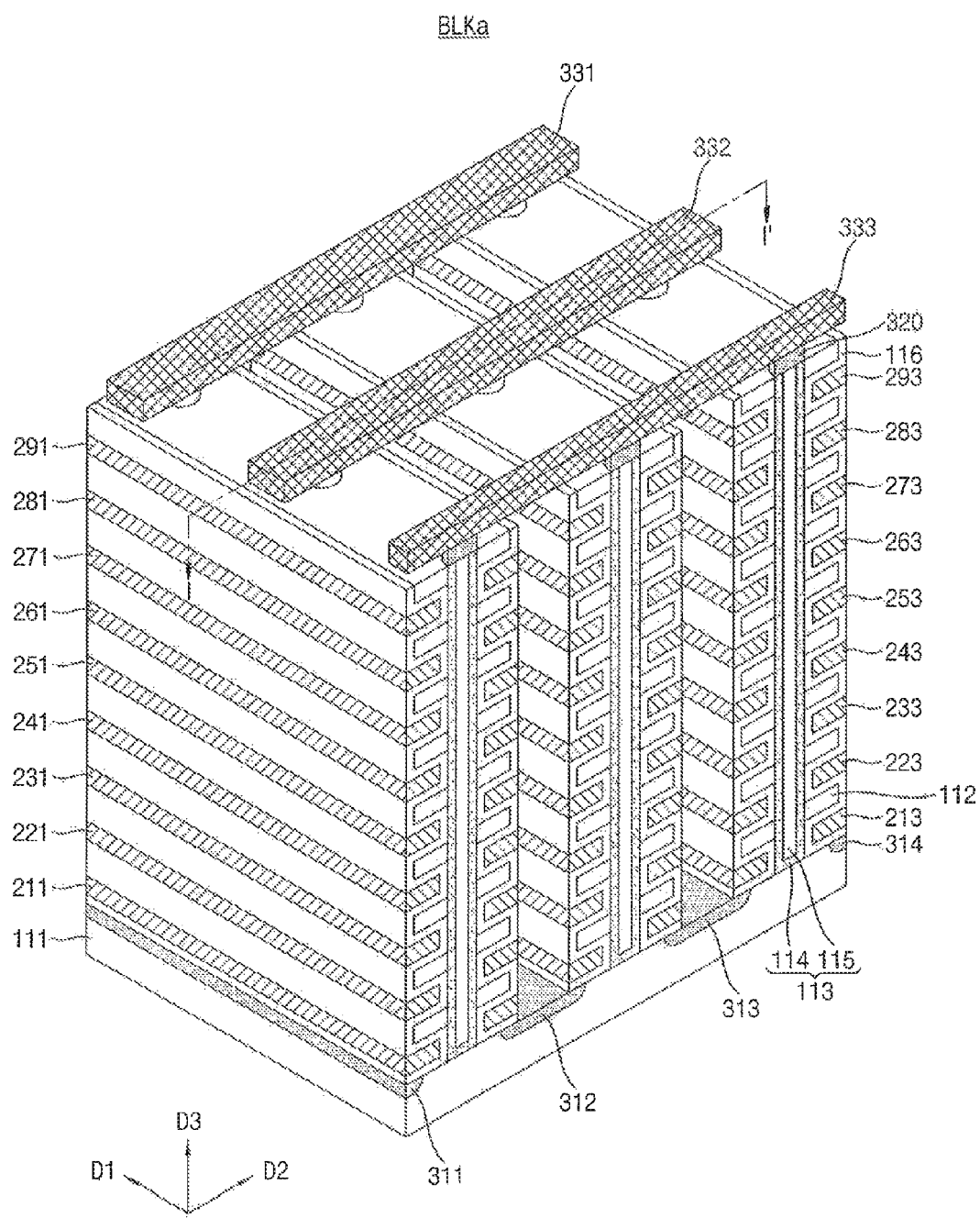
FIG. 4 is a perspective view illustrating one of the memory blocks of FIG. 3 according to an exemplary embodiment of the inventive concept.
Figure 5:
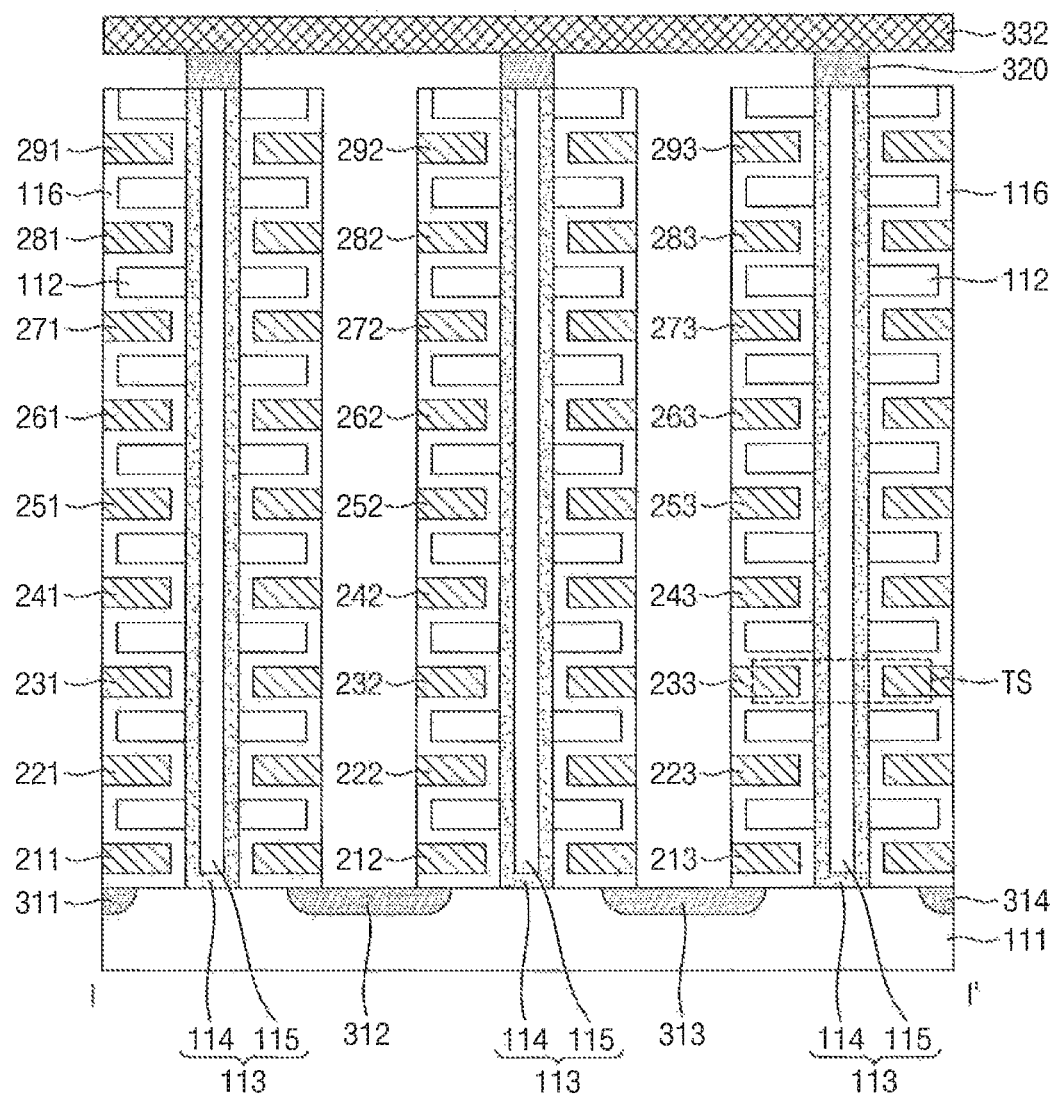
FIG. 5 is a sectional view taken along line I-I' of the memory block of FIG. 4 according to an exemplary embodiment of the inventive concept.

FIG. 4 is a perspective view illustrating one of the memory blocks of FIG. 3 according to an exemplary embodiment of the inventive concept. FIG. 5 is a sectional view taken along line I-I' of the memory block of FIG. 4 according to an exemplary embodiment of the inventive concept.

Referring to FIGS. 4 and 5, the memory block BLKa includes structures extending along first to third directions D1~D3.

A substrate 111 is provided. For example, the substrate 111 may have a well of a first type (e.g., a first conductive type). The substrate 111 may have a p-well formed by implanting a group 3 element such as boron (B). The substrate 111 may have a pocket p-well provided in an n-well. In an exemplary embodiment of the inventive concept, the substrate 111 has a p-type well (or a p-type packet well). However, the conductive type of the substrate 111 is not limited to the p-type.

A plurality of doping regions 311 to 314 extending along the first direction D1 are provided on the substrate 111. The plurality of doping regions 311 to 314 may have a second type (e.g., a second conductive type) different from the first type of the substrate 111. In an exemplary embodiment of the inventive concept, the first to fourth doping regions 311 to 314 have an n-type. However, the conductive type of the first to fourth doping regions 311 to 314 is not limited to the n-type.

A plurality of insulation materials 112 extending along the first direction D1 are sequentially provided along the second direction D2 on a region of the substrate 111 between the doping regions (e.g., the first and second doping regions 311 and 312). For example, the plurality of insulation materials 112 are provided along the second direction D2, being spaced by a specific distance. The insulation materials 112 may include an insulation material such as an oxide layer.

A plurality of pillars 113 penetrating the insulation materials 112 in the third direction D3 are sequentially disposed along the first direction D1 on a region of the substrate 111 between the doping regions (e.g. the first and second doping regions 311 and 312). For example, the plurality of pillars 113 penetrate the insulation materials 112 to contact the substrate 111.

Each pillar 113 may include a plurality of materials. For example, a channel layer 114 of each pillar 113 may include a silicon material having a first type, or the same type as the substrate 111. In an exemplary embodiment of the inventive concept, the channel layer 114 of each pillar 113 includes p-type silicon. However, the channel layer 114 of each pillar 113 is not limited to p-type silicon.

An internal material 115 of each pillar 113 includes an insulation material. For example, the internal material 115 of each pillar 113 may include insulation material such as silicon oxide or an air gap.

An insulation layer 116 is provided along the exposed surfaces of the insulation materials 112, the pillars 113, and the substrate 111, on a region between the doping regions (e.g., the first and second doping regions 311 and 312). According to an exemplary embodiment of the inventive concept, the insulation layer 116 provided on the exposed surface of the insulation material 112 that is farthest from the substrate 111 in the third direction D3 may be removed.

The thickness of the insulation layer 116 may correspond to less than half of the distance between adjacent insulation materials 112. In other words, the insulation layer 116 may be half as thick as the region between a pair of the insulation materials 112. First conductive materials 211 to 291 are provided on the exposed surface of the insulation layer 116, in a region between the doping regions (e.g., the first and second doping regions 311 and 312). For example, the first conductive material 211 extending along the first direction D1 is provided between the substrate 111 and the insulation material 112 adjacent to the substrate 111. In more detail, the first conductive material 211 extending along the first direction D1 is provided between the insulation layer 116 that is provided on the substrate 111 and the insulation layer that is provided at the bottom of the insulation material 112 adjacent to the substrate 111.

First conductive materials 212 to 292 and 213 to 293 (as shown in FIGS. 4 and 5) are substantially the same as the first conductive materials 211 to 291 and are arranged in a similar manner. Descriptions with respect to the first conductive materials 211 to 291 are also applicable to the first conductive materials 212 to 292 and 213 to 293.

The first conductive materials 221 to 291 extending along the first direction D1 are provided between the insulation materials 112 and it may be understood that the insulation layer 116 is provided between the insulation materials 112 and the first conductive materials 221 to 291. The first conductive materials 211 to 291 may include a metal material and/or a conductive material such as polysilicon.

Structures similar to those between the first and second doping regions 311 and 312 may be provided in a region between the second and third doping regions 312 and 313. In the region between the second and third doping regions 312 and 313, the plurality of insulation materials 112 extend along the first direction D1, the plurality of pillars 113 are disposed sequentially along the first direction D1 and penetrate the plurality of insulation materials 112 along the third direction D3, the insulation layer 116 is provided on the exposed surfaces of the plurality of insulation materials 112 and the plurality of pillars 113, and the plurality of first conductive materials 212 to 292 extend along the first direction D1.

In a region between the third and fourth doping regions 313 and 314, structures similar to those between the first and second doping regions 311 and 312 may be provided. In the region between the third and fourth doping regions 313 and 314, the plurality of insulation materials 112 extend along the first direction D1, the plurality of pillars 113 are disposed sequentially along the first direction D1 and penetrate the plurality of insulation materials 112 along the third direction D3, the insulation layer 116 is provided on the exposed surfaces of the plurality of insulation materials 112 and the plurality of pillars 113, and the plurality of first conductive materials 213 to 293 extend along the first direction D1.

Drains 320 are provided on the plurality of pillars 113. The drains 320 may include silicon materials doped with the second type. For example, the drains 320 may include silicon materials doped with an n-type. In an exemplary embodiment of the inventive concept, the drains 320 include n-type silicon materials. However, the drains 320 are not limited to n-type silicon materials.

The width of each drain 320 may be greater than the width of each pillar 113. For example, each drain 320 may be provided in a pad form on top of the corresponding pillar 113. Each drain 320 may extend to a portion of the channel layer 114 of the corresponding pillar 113.

On the drains 320, the second conductive materials 331 to 333, extending along the second direction D2, are provided. The second conductive materials 331 to 333 are disposed along the first direction D1 and spaced apart by a specific distance. The second conductive materials 331 to 333 are connected to the drains 320 in a corresponding region. The drains 320 and the second conductive materials 331 to 333 may be connected through contact plugs along the third direction D3. The second conductive materials 331 to 333 may include metal materials and/or conductive materials such as polysilicon.

The first conductive materials 211 to 291 may have first to ninth heights, respectively. In other words, the first conductive material 211 adjacent to the substrate 111 has the first height. The first conductive material 291 adjacent to the second conductive materials 331 to 333 has the ninth height. The heights of the first conductive materials 211 to 291 may increase the further the corresponding first conductive material is from the substrate 111, e.g., the second height is greater than the first height, the third height is greater than the second height, etc.

Referring to FIGS. 4 and 5, the pillars 113, the insulation layer 116, and the first conductive materials 211 to 291, 212 to 292, and 213 to 293 may form cell strings. For example, each pillar 113, an adjacent region of the insulation layer 116, and an adjacent region of the first conductive materials 211 to 291, 212 to 292, and 213 to 293 form a cell string. The cell string includes a plurality of transistor structures TS.

Figure 6:
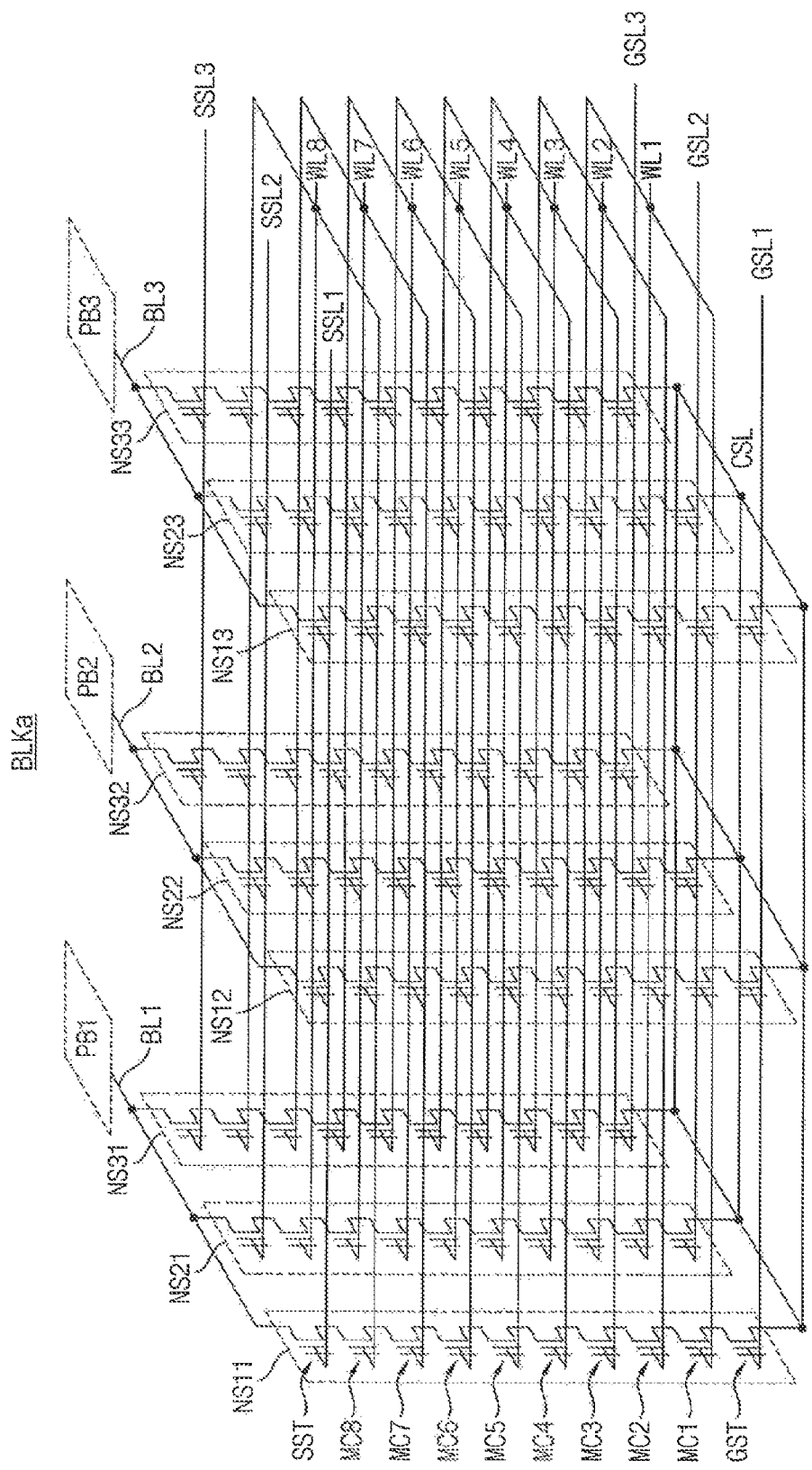
FIG. 6 is a circuit diagram illustrating an equivalent circuit of the memory block described with reference to FIGS. 4 and 5 according to an exemplary embodiment of the inventive concept.

FIG. 6 is a circuit diagram illustrating an equivalent circuit of the memory block described with reference to FIGS. 4 and 5 according to an exemplary embodiment of the inventive concept.

The memory block BLKa of FIG. 6 may be formed on a substrate in a three-dimensional structure (or a vertical structure). For example, a plurality of cell strings included in the memory block BLKa may be formed in a direction perpendicular to the substrate.

Referring to FIG. 6, the memory block BLKa may include memory cell strings NS11 to NS33 coupled between bit-lines BL1, BL2, and BL3 and a common source line CSL.

Each of the memory cell strings NS11 to NS33 may include a string selection transistor SST, a plurality of memory cells MCI to MC8, and a ground selection transistor GST. In FIG. 6, each of the memory cell strings NS11 to NS33 is illustrated to include eight memory cells MCI to MC8, one string select selection transistor SST, and one ground selection transistor GST. However, exemplary embodiments are not limited thereto. For example, each of the memory cell strings NS11 to NS33 may include any number of memory cells, as well as two or more string selection transistors and/or two or more ground selection transistors.

The string selection transistors SST of the memory cell strings NS11 to NS13, NS21 to NS23, and NS31 to NS33 may be connected to corresponding string selection lines SSL1 to SSL3, respectively. The plurality of memory cells MCI to MC8 of each of the memory cell strings NS11 to NS33 may be connected to corresponding word-lines WL1 to WL8, respectively. The ground selection transistors GST of the memory cell strings NS11 to NS13, NS21 to NS23, and NS31 to NS33 may be connected to corresponding ground selection lines GSL1 to GSL3, respectively. The string selection transistors SST of the memory cell strings NS11 to NS31, NS12 to NS32, and NS13 to NS33 may be connected to corresponding bit-lines BL1, BL2, and BL3, respectively, and the ground selection transistors GST may be connected to the common source line CSL. The bit-lines BL1, BL2, and BL3 may be coupled to corresponding page buffers PB1, PB2, and PB3, respectively.

Figure 8:
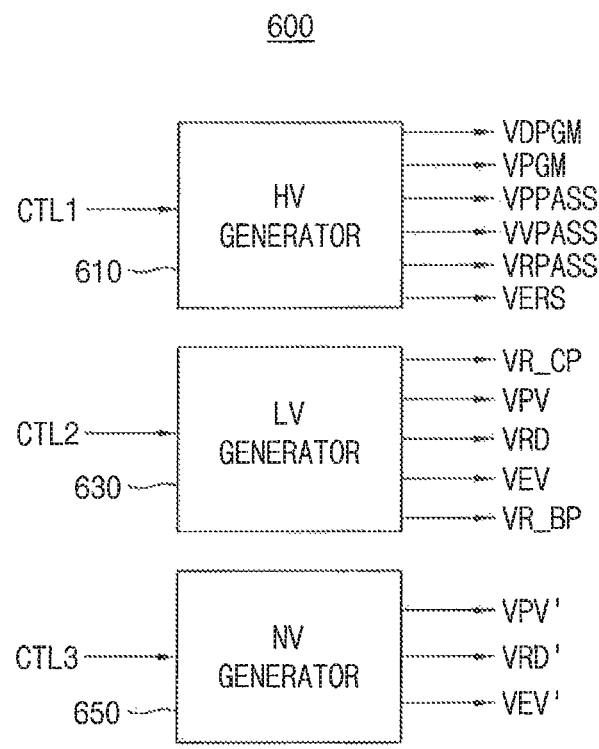
FIG. 8 is a block diagram illustrating a voltage generator in the nonvolatile memory device of FIG. 2 according to an exemplary embodiment of the inventive concept.

Word-lines (e.g., WL1) having the same height may be commonly connected, and the ground selection lines GSL1 to GSL3 and the string selection lines SSL1 to SSL3 may be separate. In FIG. 8, the memory block BLKa includes eight word-lines WL1 to WL8 and three bit-lines BL1 to BL3. However, exemplary embodiments are not limited thereto. For example, the memory block BLKa may include any number of word-lines and bit-lines.

Referring again to FIG. 2, the control circuit 500 may receive the command signal CMD and the address signal ADDR from an external device (e.g., the memory controller 20 of FIG. 1), and control an erase loop, a program loop, a dummy program operation and a read operation of the nonvolatile memory device 30 based on the command signal CMD and the address signal ADDR. The program loop may include a program operation and a program verification operation. The erase loop may include an erase operation, an erase verification operation, and at least one sensing operation.

For example, the control circuit 500 may generate control signals CTLs (used for controlling the voltage generator 600), a control signal PBC (used for controlling the page buffer circuit 410) based on the command signal CMD, and a row address R_ADDR and a column address C_ADDR based on the address signal ADDR. The control circuit 500 may provide the row address R_ADDR to the address decoder 430 and the column address C_ADDR to the data input/output circuit 420.

The address decoder 430 may be coupled to the memory cell array 100 through the at least one string selection line SSL, the plurality of word-lines WLs, and the at least one ground selection line GSL. During the program operation or the read operation, the address decoder 430 may determine one of the plurality of word-lines WLs as a selected word-line and determine the rest of the plurality of word-lines WLs as unselected word-lines based on the row address R_ADDR.

The voltage generator 600 may generate word-line voltages VWLs, which are required for the operation of the nonvolatile memory device 30, based on the control signals CTLs. The word-line voltages VWLs may be applied to the plurality of word-lines WLs through the address decoder 430.

According to an exemplary embodiment of the inventive concept, during the erase operation, the voltage generator 600 may apply an erase voltage to a well of the memory block and may apply a ground voltage to all of the word-lines of the memory block. During the erase verification operation, the voltage generator 600 may apply an erase verification voltage to all of the word-lines of the memory block, or sequentially apply the erase verification voltage to the word-lines on a word-line-by-word-line basis.

According to an exemplary embodiment of the inventive concept, during the program operation, the voltage generator 600 may apply a program voltage to the selected word-line and a program pass voltage to the unselected word-lines. In addition, during the program verification operation, the voltage generator 600 may apply a program verification voltage to the selected word-line and a verification pass voltage to the unselected word-lines.

According to an exemplary embodiment of the inventive concept, during the dummy program operation, the voltage generator 600 may apply a dummy program voltage to word-lines coupled to the dummy page and clean pages.

According to an exemplary embodiment of the inventive concept, during the read operation, the voltage generator 600 may apply a read voltage to the selected word-line and a read pass voltage to the unselected word-lines.

The page buffer circuit 410 may be coupled to the memory cell array 100 through the plurality of bit-lines BLs. The page buffer circuit 410 may include a plurality of page buffers. According to exemplary embodiments of the inventive concept, one page buffer may be connected to one bit-line. According to exemplary embodiments of the inventive concept, one page buffer may be connected to two or more bit-lines.

The page buffer circuit 410 may temporarily store data to be programmed in a selected page or data read out from the selected page.

The data input/output circuit 420 may be coupled to the page buffer circuit 410 through data lines DLs. During the program operation, the data input/output circuit 410 may receive program data DATA from an external device (e.g., the memory controller 20 of FIG. 1) and provide the program data DATA to the page buffer circuit 410 based on the column address C_ADDR received from the control circuit 500. During the read operation, the data input/output circuit 420 may provide read data DATA, which is stored in the page buffer circuit 410, to the external device based on the column address C_ADDR received from the control circuit 500.

In addition, the page buffer circuit 410 and the data input/output circuit 420 read data from a first area of the memory cell array 100 and write the read data to a second area of the memory cell array 100. In other words, the page buffer circuit 410 and the data input/output circuit 420 may perform a copy-back operation.

Figure 7:
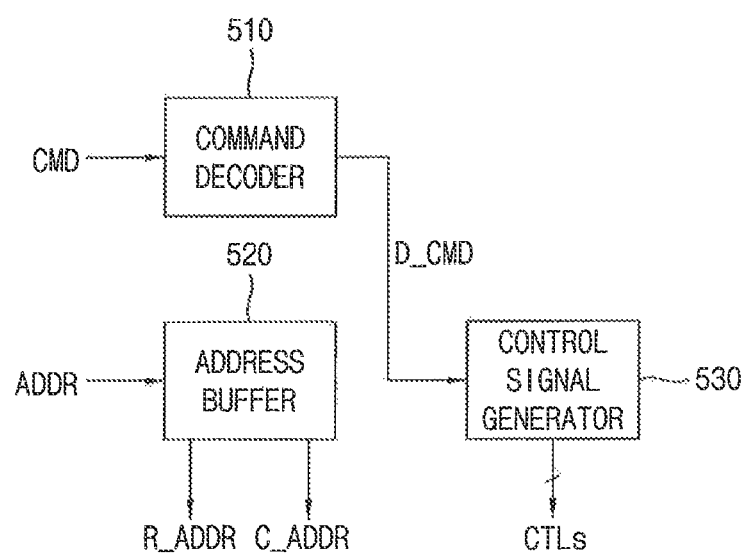
FIG. 7 is a block diagram illustrating a control circuit in the nonvolatile memory device of FIG. 2 according to an exemplary embodiment of the inventive concept.

FIG. 7 is a block diagram illustrating the control circuit in the nonvolatile memory device of FIG. 2 according to an exemplary embodiment of the inventive concept.

Referring to FIG. 7, the control circuit 500 includes a command decoder 510, an address buffer 520, and a control signal generator 530.

The command decoder 510 decodes the command CMD and provides a decoded command D_CMD to the control signal generator 530.

The address buffer 520 receives the address signal ADDR, provides the row address R_ADDR to the address decoder 430 (as shown in FIG. 2) and provides the column address C_ADDR to the data input/output circuit 420 (as shown in FIG. 2).

The control signal generator 530 receives the decoded command D_CMD, generates the control signals CTLs based on an operation directed by the decoded command D_CMD, and provides the control signals CTLs to the voltage generator 600 (as shown in FIG. 2).

FIG. 8 is a block diagram illustrating the voltage generator in the nonvolatile memory device of FIG. 2 according to an exemplary embodiment of the inventive concept.

Referring to FIG. 8, the voltage generator 600 includes a high voltage generator 610 and a low voltage generator 630. The voltage generator 600 may further include a negative voltage generator 650.

The high voltage generator 610 may generate a program voltage VPGM, a program pass voltage VPPASS, a verification pass voltage VVPASS, a read pass voltage VRPASS, a dummy program voltage VDPGM, and an erase voltage VERS according to operations directed by the decoded command D_CMD, in response to a first control signal CTL1. The program voltage VPGM may be applied to the selected word-line. The program pass voltage VPPASS, the verification pass voltage VVPASS, and the read pass voltage VRPASS may be applied to the unselected word-lines. The erase voltage VERS may be applied to the well of the memory block. The dummy program voltage VDPGM may be applied to the word-lines coupled to the boundary page and clean pages. The first control signal CTL1 may include a plurality of bits that indicate the operations directed by the decoded command D_CMD.

The low voltage generator 630 may generate a program verification voltage VPV, a read voltage VRD, an erase verification voltage VEV, a clean page read voltage VR_CP, and a boundary page read voltage VR_BP according to operations directed by the decoded command D_CMD, in response to a second control signal CTL2. The program verification voltage VPV, the read voltage VRD, and the erase verification voltage VEV may be applied to the selected word-line according to an operation of the nonvolatile memory device 100. The clean page read voltage VR_CP and the boundary page read voltage VR_BP may be applied to word-lines of a first memory block at sudden power-off. The second control signal CTL2 may include a plurality of bits that indicate the operations directed by the decoded command D_CMD.

The negative voltage generator 650 may generate a program verification voltage VPV', a read voltage VRD', and an erase verification voltage VEV' which have negative levels according to operations directed by the decoded command D_CMD, in response to a third control signal CTL3. The third control signal CTL3 may include a plurality of bits that indicate the operations directed by the decoded command D_CMD.

Figure 9:
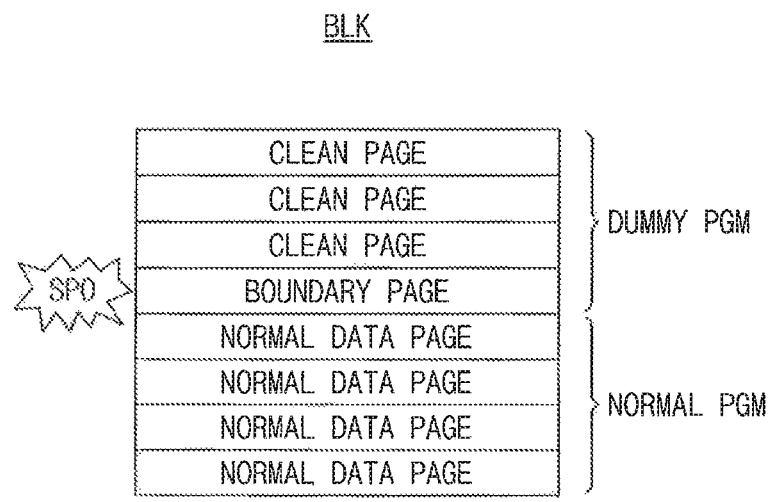
FIG. 9 is a diagram illustrating a program operation on a memory block according to an exemplary embodiment of the inventive concept.

FIG. 9 is a diagram illustrating a program operation on a memory block according to an exemplary embodiment of the inventive concept. It is assumed that a boundary page is generated due to sudden power-off.

Referring to FIG. 9, normal pages on which a normal program operation was performed are disposed immediately below the boundary page. Clean pages in which data is not written (e.g., on which the normal program operation is not performed) are disposed immediately above the boundary page. The dummy program operation is performed on the boundary page and the clean pages such that threshold voltages of memory cells of the boundary page and the clean pages are shifted, and then an erase operation is performed on the boundary page and the clean pages. Therefore, deep erase on the boundary page and the clean pages may be prevented.

The dummy program operation on the boundary page and the clean pages may be performed by applying a one-shot pulse to word-lines coupled to the boundary page and the clean pages. The time required for the dummy program operation may be shorter than the time required for the normal program operation.

In FIG. 9, it is assumed that the boundary page may be generated due to sudden power-off SPO; however, the boundary page may be generated due to a request from a host. In other words, when the memory controller 20 detects a first event, the memory controller 20 controls the nonvolatile memory device 30 to perform the dummy program operation on a portion of the boundary page and the clean pages. The first event may be a sudden power-off SPO or the request from the host.

Figure 10:
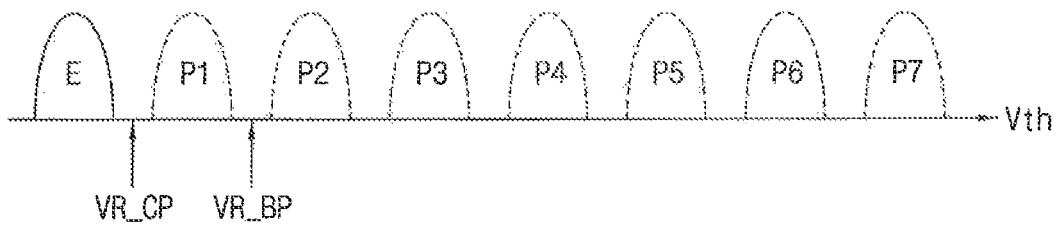
FIG. 10 is a diagram for describing a boundary page searching operation and a clean page searching operation according to an exemplary embodiment of the inventive concept.

FIG. 10 is a diagram for describing a boundary page searching operation and a clean page searching operation according to an exemplary embodiment of the inventive concept. For ease of description, in the example illustrated in FIG. 10, it is assumed that 3-bit data is stored in each memory cell. For example, as illustrated in FIG. 10, as the program operation is performed, a threshold voltage Vth of the memory cell may be changed to have one of erase state E or program states P1 to P7.

The boundary page read voltage VR_BP may be used to search for a boundary page of a memory block. A boundary page may be searched for by sequentially performing read operations with the boundary page read voltage VR_BP applied to word-lines of the memory block. For example, if the number of memory cells connected to a particular word-line and having threshold voltages higher than the boundary page read voltage VR_BP (or, memory cells which are in an off-state by the boundary page read voltage VR_BP) is greater than a reference value, a page corresponding to the particular word-line may be determined to be a boundary page.

The clean page read voltage VR_CP may be used to search for a clean page of a memory block. For example, a clean page may be searched for by sequentially performing read operations with the clean page read voltage VR_CP applied to some of the word-lines of the memory block. For example, according to an exemplary embodiment of the inventive concept, if the number of memory cells connected to a particular word line and having threshold voltages higher than the clean page read voltage VR_CP (or, memory cells which are in an off-state by the clean page read voltage VR_CP) is smaller than a reference value, a page corresponding to the particular word line may be determined to be a clean page.

According to an exemplary embodiment of the inventive concept, the clean page read voltage VR_CP may be lower than the boundary page read voltage VR_BP.

According to an exemplary embodiment of the inventive concept, the boundary page read voltage VR_BP may vary according to a number of data bits stored in each of the memory cells. The boundary page read voltage VR_BP may vary depending on whether each of the memory cells stores single bit data or two-bit data.

Figure 11A:
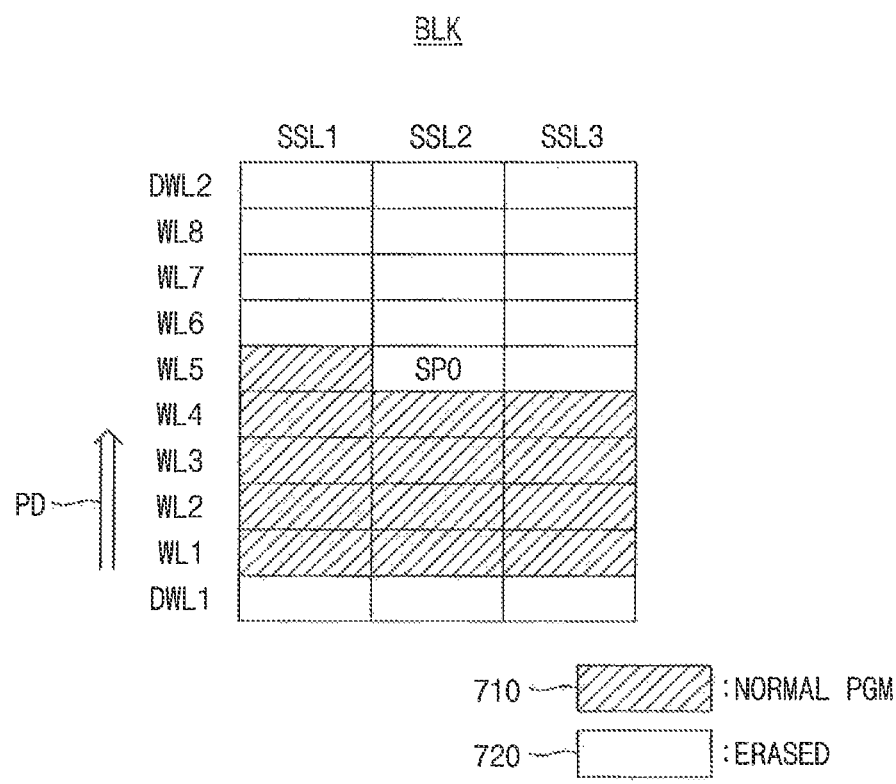
FIGS. 11A through 11C illustrate a method of operating a storage device according to an exemplary embodiment of the inventive concept.
Figure 11B:
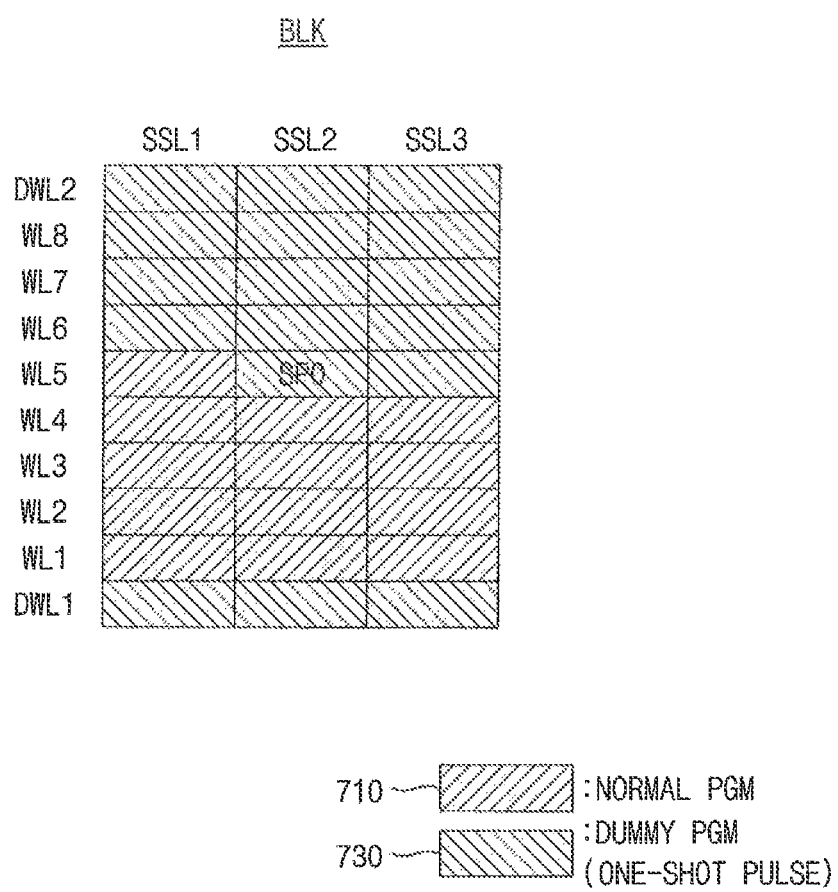
Figure 11C:
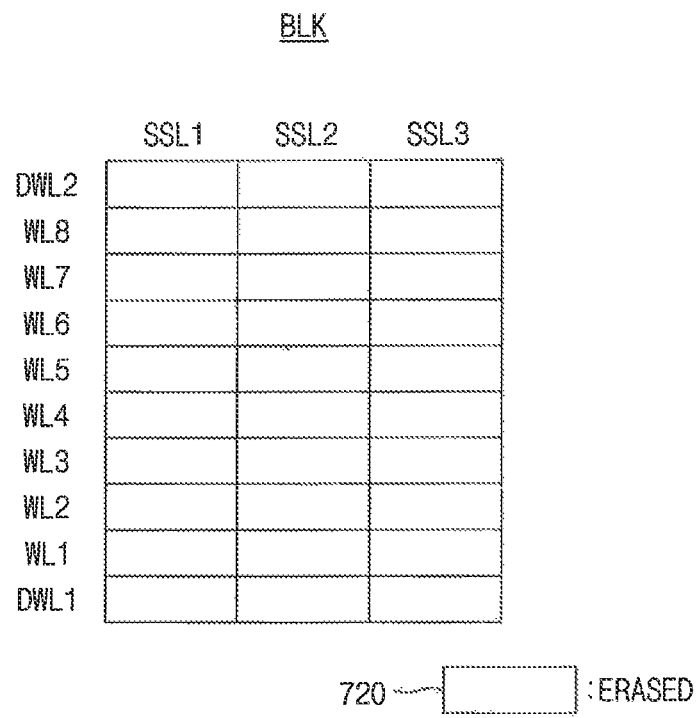

FIGS. 11A through 11C illustrate a method of operating a storage device according to an exemplary embodiment of the inventive concept.

In particular, FIGS. 11A through 11C illustrate a method of operating a first memory block BLK.

In FIGS. 11A through 11C, it is assumed that the first memory block BLK includes a plurality of memory cells coupled to dummy word-lines DWL1 and DWL2, a plurality of word-lines WL1~WL8, and string selection lines SSL1~SSL3.

In FIGS. 11A through 11C, a reference numeral 710 denotes memory cells on which a normal program operation is performed, a reference numeral 720 denotes memory cells having an erase state, and reference numeral 730 denotes memory cells on which a dummy program operation is performed.

Referring to FIG. 11A, the normal program operation is performed on memory cells coupled to word-lines WL1~WL4 along a direction PD. It is assumed that the sudden power off SPO occurs while the normal program operation is performed on memory cells coupled to a fifth word-line WL5. In other words, it is assumed that the sudden power off SPO occurs while the normal program operation is performed on memory cells coupled to the fifth word-line WL5 and the string selection line SSL2. Therefore, the normal program operation was performed on the memory cells coupled to the word-lines WL1~WL4 and thus normal program data was stored in the memory cells coupled to the word-lines WL1~WL4. A page coupled to the fifth word-line WL5 becomes a boundary page and pages coupled to word-lines WL6~WL8 immediately above the fifth word-line WL5 may be clean pages because the normal program operation has not been performed on the memory cells coupled to the word-lines WL6~WL8.

Referring to FIG. 11B, the dummy program determinator 25, in the memory controller 20, searches for the boundary page coupled to the word-line WL5 and the clean pages coupled to the word-lines WL6~WL8 based on a sudden power-off information SPO_INF and performs a dummy program operation on the boundary page coupled to WL5 and the clean pages coupled to WL6~WL8. The dummy program operation may also be performed on dummy memory cells coupled to the dummy word-lines DWL1 and DWL2.

Referring to FIG. 11C, when the dummy program operation on the boundary page coupled to WL5 and the clean pages coupled to WL6~WL8 is completed, the memory controller 20 performs an erase operation on the first memory block BLK. As described above, when the sudden power off occurs, deep erase may be prevented by performing the dummy program operation only on the boundary page and the clean pages.

Figure 12:
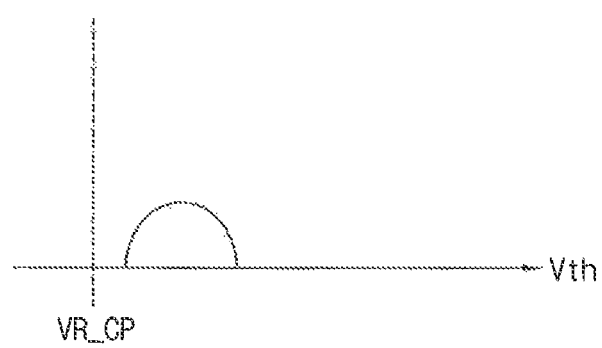
FIG. 12 illustrates a threshold voltage distribution of the memory cells in a boundary page and clean pages after a dummy program operation according to an exemplary embodiment of the inventive concept.

FIG. 12 illustrates a threshold voltage distribution of the memory cells in the boundary page and the clean pages after the dummy program operation according to an exemplary embodiment of the inventive concept.

Referring to FIG. 12, when the dummy program operation is performed on the boundary page and the clean pages, and a dummy program pulse is applied to the word-lines coupled to the boundary page and the clean pages, the threshold voltages Vth of the memory cells in the boundary page and the clean pages are greater than the clean page read voltage VR_CP.

Figure 13:
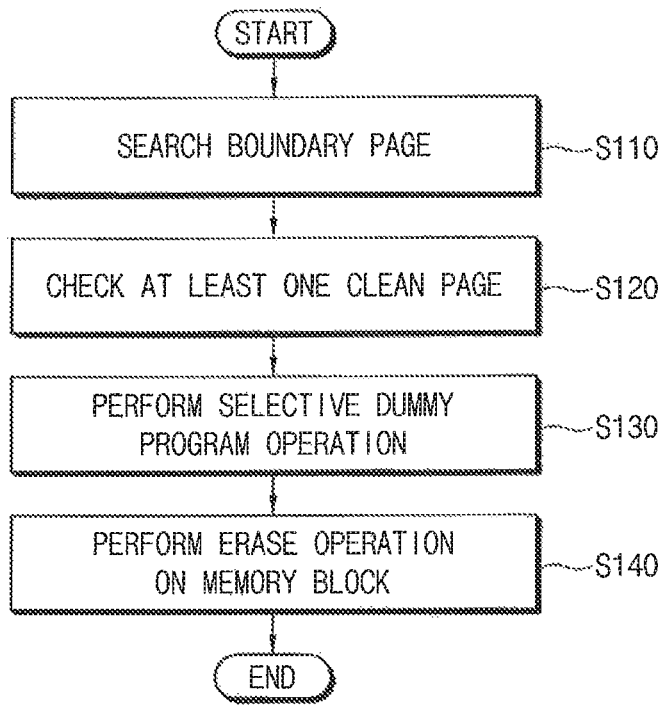
FIG. 13 is a flowchart illustrating a method of operating a storage device according to an exemplary embodiment of the inventive concept.

FIG. 13 is a flowchart illustrating a method of operating a storage device according to an exemplary embodiment of the inventive concept.

Referring to FIGS. 1 through 13, in a method of operating a storage device 10 that includes at least one nonvolatile memory device 30 and a memory controller 20 that controls the at least one nonvolatile memory device 30, if, at power-on, the storage device 10 recognizes that sudden power-off occurred, a boundary page search operation may be performed to search for a boundary page of a first memory block at which sudden power-off information was generated during a normal program operation (S110). Here, the boundary page search operation may be performed as described with reference to FIG. 10. The first memory block may be erased before the normal program operation is performed on the first memory block.

After a boundary page is found, a clean page search operation may be performed to check a state of at least one clean page above the boundary page (S120). Here, the clean page search operation may be performed as described with reference to FIG. 10.

A dummy program operation may be selectively performed on at least a portion of the boundary page and the clean pages (S130). A one-shot pulse may be applied to the word-lines coupled to the boundary page and the clean pages and thus threshold voltages of the memory cells coupled to the at least a portion of the boundary page and the clean pages may be changed.

After the dummy program operation is selectively performed on the at least a portion of the boundary page and the clean pages, an erase operation is performed on the first memory block (S140). Therefore, a deep erase on the first memory block, in which the first memory block is continuously erased, may be prevented.

Figure 14:
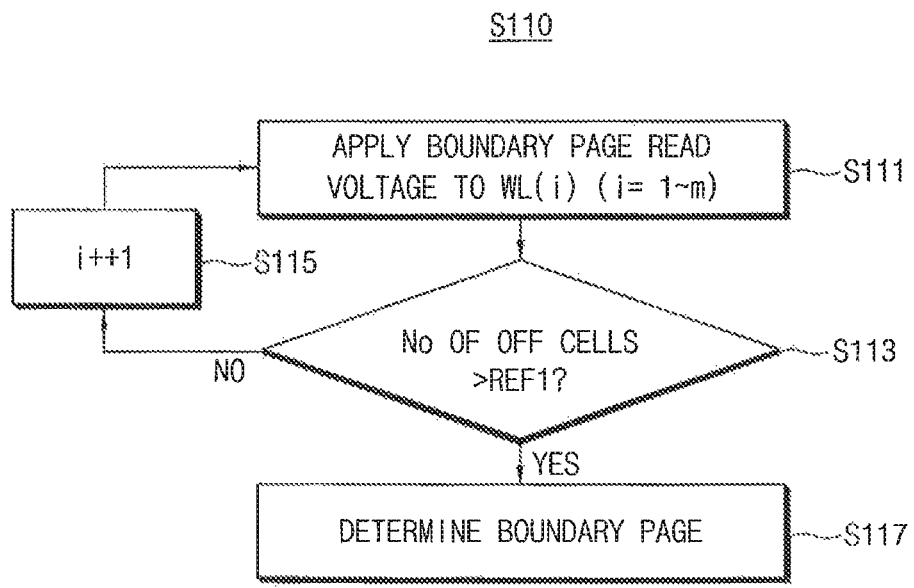
FIG. 14 is a flowchart illustrating a boundary page search operation in the method of FIG. 13 according to an exemplary embodiment of the inventive concept.

FIG. 14 is a flowchart illustrating the boundary page search operation in the method of FIG. 13 according to an exemplary embodiment of the inventive concept.

Referring to FIGS. 9 through 11A and 14, to search for the boundary page (S110), a boundary page read voltage VR_BP is applied to word-lines WL1~WLm of the first memory block BLK and a read operation is sequentially performed on the word-lines WL1~WLm (S111, S113, and S115). A page may be determined to be the boundary page if the page corresponds to a word-line in which the number of memory cells in an off-state is greater than a reference value REF1 (S117).

In FIG. 13, the boundary page is searched for before the dummy program operation is performed. However, according to an exemplary embodiment of the inventive concept, the dummy program operation may be performed after an initial clean page is searched for and found, instead of searching for the boundary page. The previous page of the initial clean page may be determined to be the boundary page.

Figure 15:
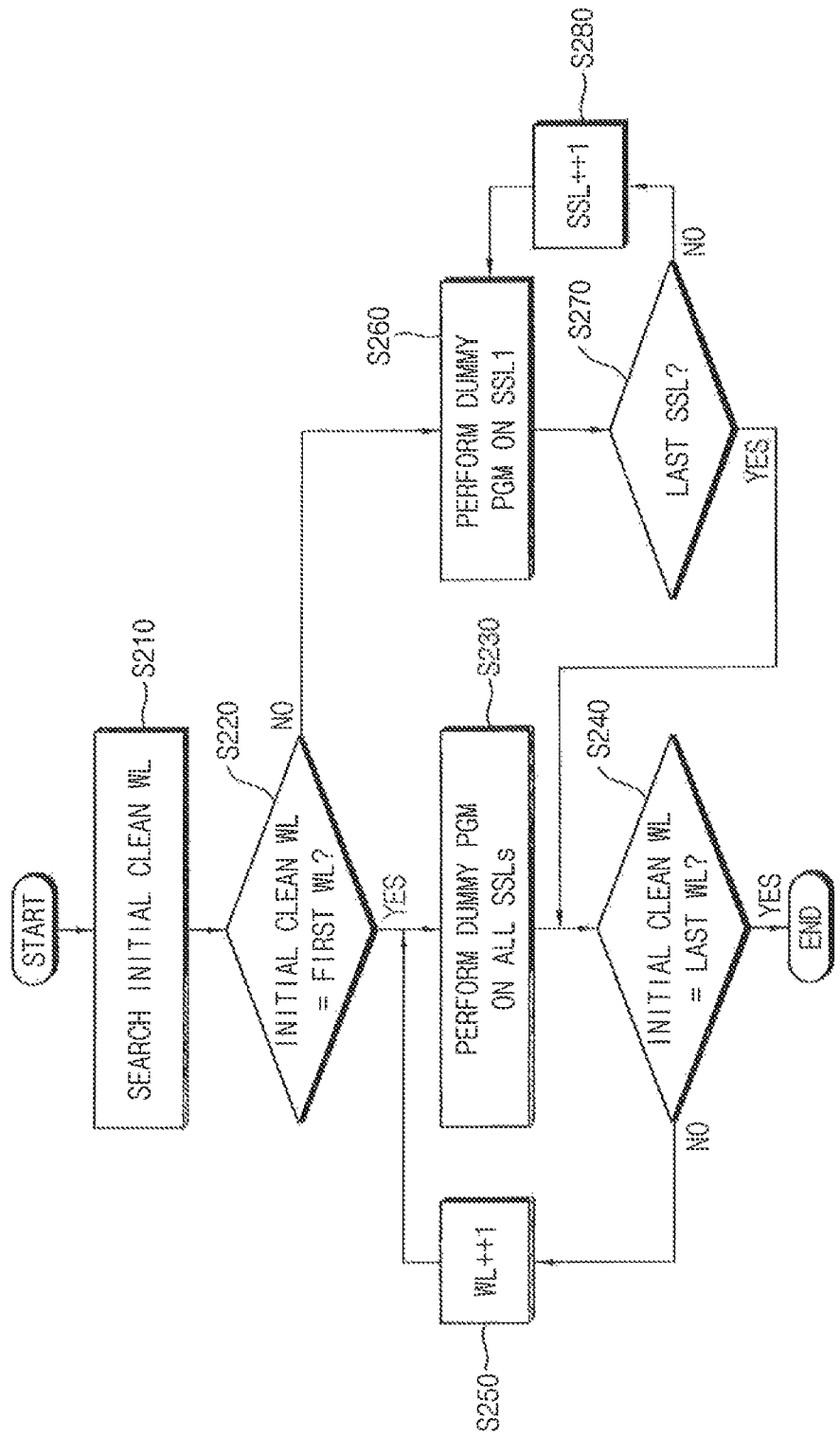
FIG. 15 is a flowchart illustrating a method of operating a storage device according to an exemplary embodiment of the inventive concept.

FIG. 15 is a flowchart illustrating a method of operating a storage device according to an exemplary embodiment of the inventive concept.

Referring to FIGS. 1 through 12 and 15, in a method of operating a storage device 10 that includes at least one nonvolatile memory device 30 and a memory controller 20 that controls the at least one nonvolatile memory device 30, if, at power-on, the storage device 10 recognizes that sudden power-off occurred, an initial clean word-line may be searched for through binary searching on a first memory block (S210). For example, the initial clean word-line may be determined through a clean page search operation on word-lines as described with reference to FIG. 10. In this case, the likelihood may be high that a page corresponding to a word-line immediately below the initial clean word-line is a boundary page.

It is determined whether the initial clean word-line is a first word-line corresponding to a lowest word-line of the first memory block (S220).

When the initial clean word-line is the first word-line of the first memory block (YES in S220), the dummy program operation is sequentially performed on memory cells coupled to all of the string selection lines on a word-line-by-word-line basis because a boundary page does not exist in the first memory block (S230, S240, and S250).

When the initial clean word-line is not the first word-line of the first memory block (NO in S220), the dummy program operation is sequentially performed on memory cells coupled to each of the string selection lines from the boundary page to a page coupled to the highest word-line because a boundary page exists in the first memory block (S260, S270, and S280).

Figure 16:
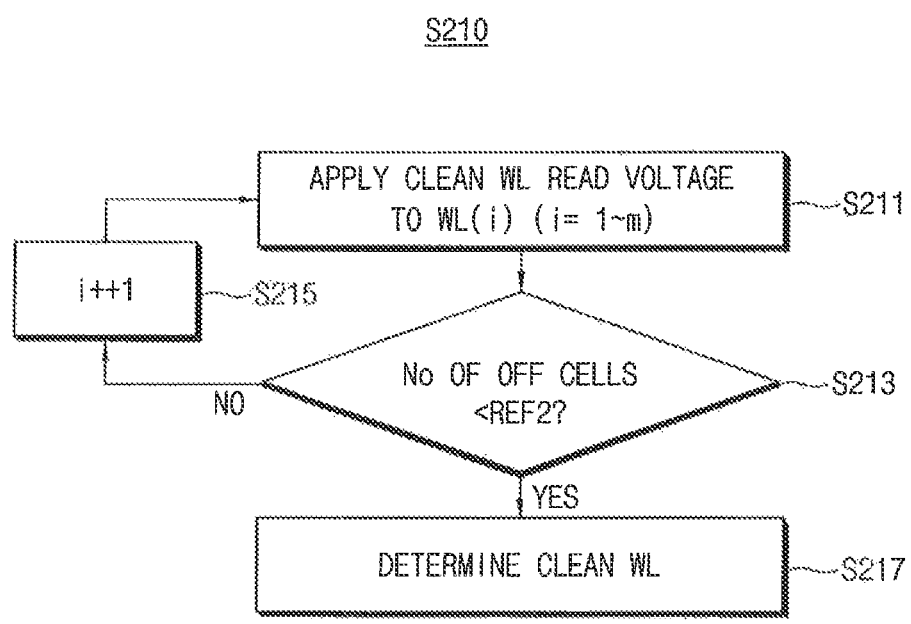
FIG. 16 is a flowchart illustrating an initial clean page search operation in the method of FIG. 15 according to an exemplary embodiment of the inventive concept.

FIG. 16 is a flowchart illustrating the initial clean page search operation in the method of FIG. 15 according to an exemplary embodiment of the inventive concept.

Referring to FIGS. 9 through 11A and 16, to search for the initial clean word-line (S210), a clean page read voltage VR_CP is applied to word-lines WL1~WLm of the first memory block BLK and a read operation is sequentially performed on the word-lines WL1~WLm (S211, S213, and S215). A word-line may be determined to be the initial clean word-line if it corresponds to a word-line in which the number of memory cells in an off-state is smaller than a reference value REF2 (S217).

Figure 17:
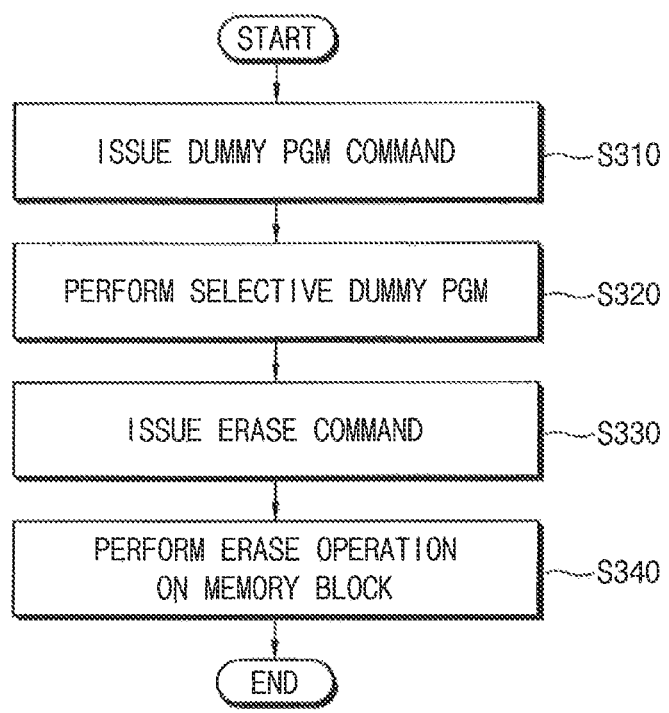
FIG. 17 is a flowchart illustrating a method of operating a storage device of FIG. 1 according to an exemplary embodiment of the inventive concept.

FIG. 17 is a flowchart illustrating a method of operating a storage device of FIG. 1 according to an exemplary embodiment of the inventive concept.

Referring to FIGS. 1 through 12 and 17, if, at power-on, the storage device 10 recognizes that sudden power-off occurred, the memory controller 20 may issue a dummy program command to the nonvolatile memory device 30 after searching for a boundary page and at least one clean page (S310). In response to the dummy program command, the nonvolatile memory device 30 may selectively perform a dummy program operation on at least a portion of the boundary page and the clean pages (S320). After the dummy program operation is completed, the memory controller 20 may issue an erase command on a first memory block (S330). The nonvolatile memory device 30 may perform an erase operation on the first memory block (S340).

As described above, when the sudden power off occurs, the storage device 10 may prevent a deep erase by performing the dummy program operation on the at least a portion of the boundary page and the clean pages before performing the erase operation on the memory block.

Figure 18:
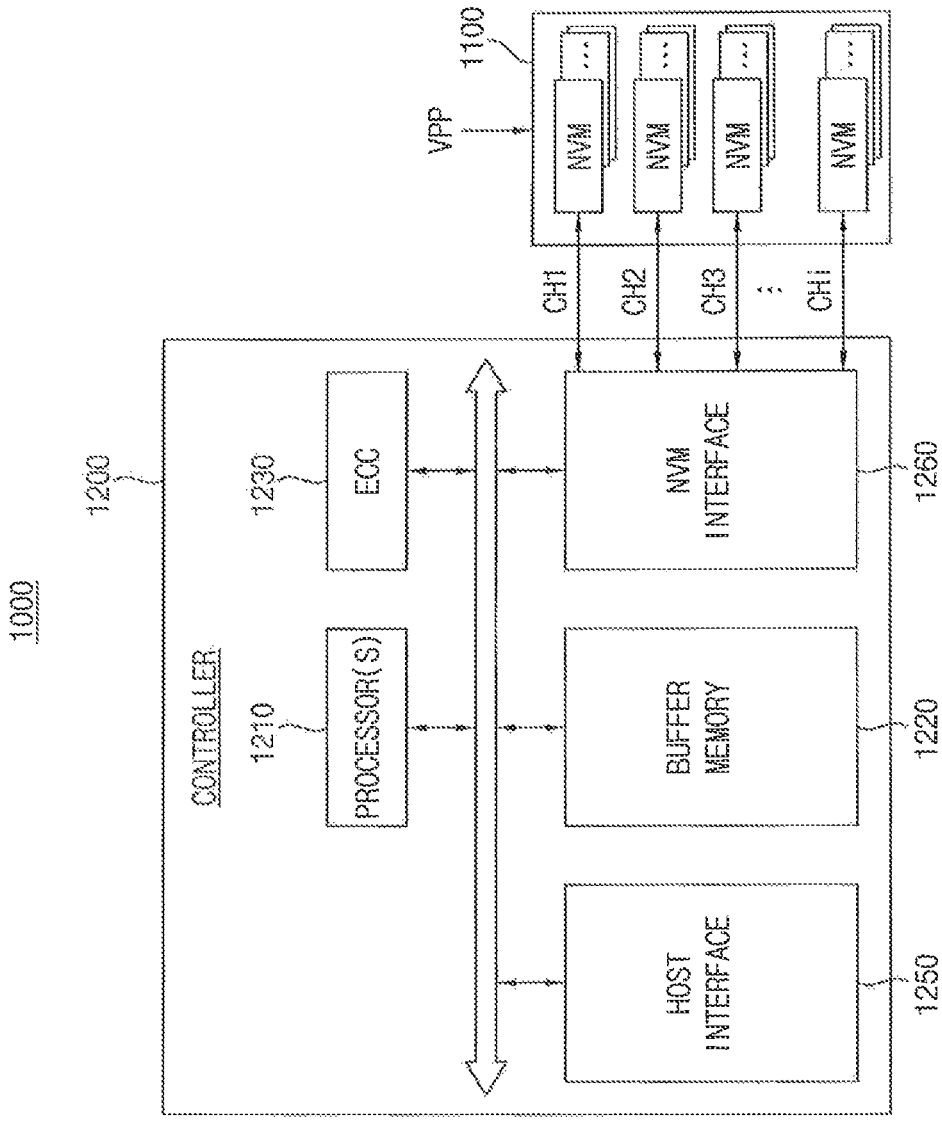
FIG. 18 is a block diagram illustrating a solid state disk or solid state drive (SSD) according to an exemplary embodiment of the inventive concept.

FIG. 18 is a block diagram illustrating a solid state disk or solid state drive (SSD) according to an exemplary embodiment of the inventive concept.

Referring to FIG. 18, an SSD 1000 includes multiple nonvolatile memory devices 1100 and an SSD controller 1200.

The nonvolatile memory devices 1100 may be optionally supplied with an external high voltage VPP. Each of the nonvolatile memory devices 1100 may include the nonvolatile memory device 30 of FIG. 2. Each of the nonvolatile memory devices 1100 may perform the dummy program operation on at least a portion of the boundary page and the clean pages before performing the erase operation on a first memory block when sudden power off occurs in the first memory block during the normal program operation, as described above. As such, a deep erase may be prevented and performance may be enhanced.

The SSD controller 1200 is connected to the nonvolatile memory devices 1100 through multiple channels CH1 to CHi. The SSD controller 1200 includes one or more processors 1210, a buffer memory 1220, an ECC block 1230, a host interface 1250, and a nonvolatile memory interface 1260.

The buffer memory 1220 stores data used to drive the SSD controller 1200. The buffer memory 1220 includes multiple memory lines that each store data or a command. Although FIG. 18 illustrates an exemplary embodiment where the buffer memory 1220 is included in the SSD controller 1200, the inventive concept is not limited thereto. For instance, the buffer memory 1220 may be placed outside the SSD controller 1200.

The ECC block 1230 calculates error correction code values of data to be programmed during a writing operation and corrects errors in read data using an error correction code value during a read operation. In a data recovery operation, the ECC block 1230 corrects errors in data recovered from the nonvolatile memory devices 1100. Although not shown in FIG. 18, a code memory may be further included to store code data needed to drive the SSD controller 1200. The code memory may be implemented by at least one of the nonvolatile memory devices 1100.

The host interface 1250 provides an interface with an external device. The nonvolatile memory interface 1260 provides an interface with the nonvolatile memory devices 1100.

Figure 19:
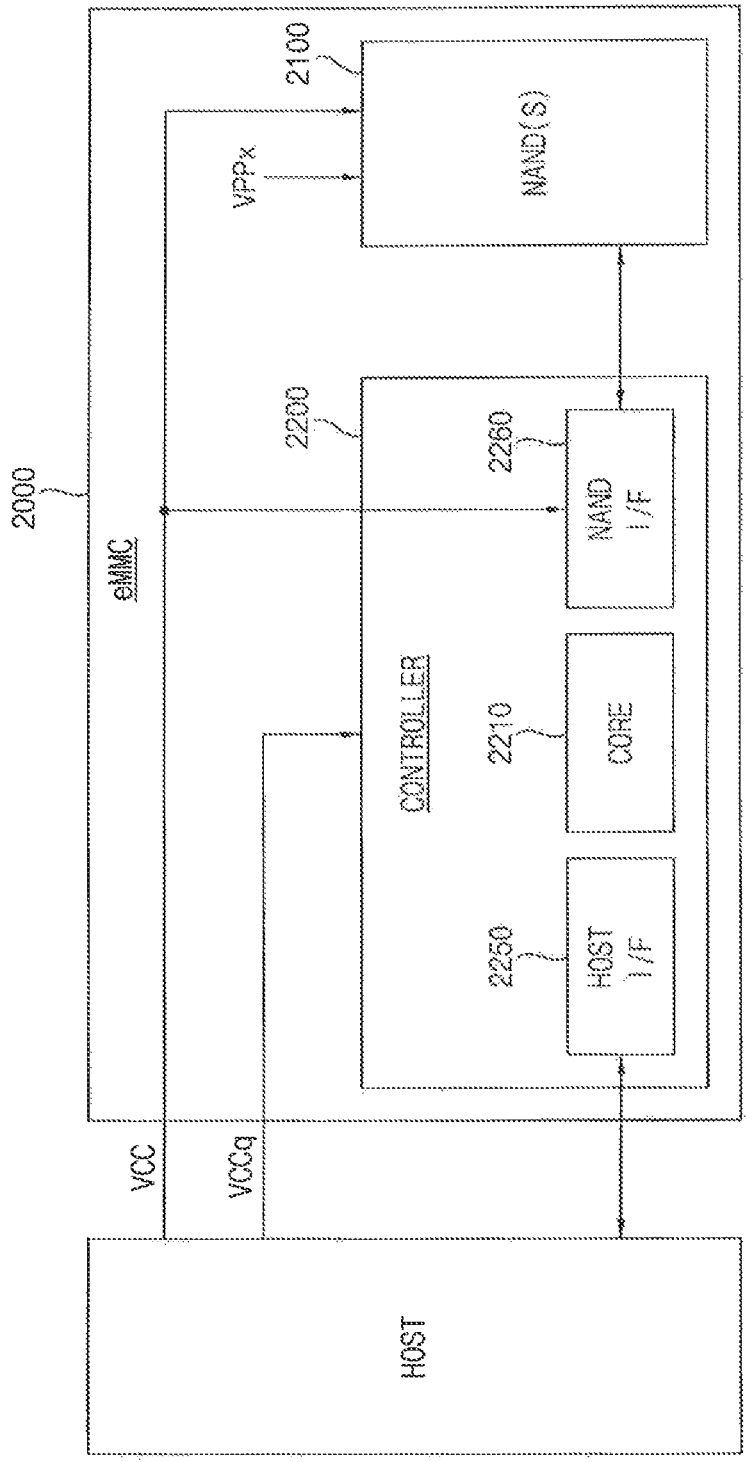
FIG. 19 is a block diagram illustrating an embedded multi-media card (eMMC) according to an exemplary embodiment of the inventive concept.

FIG. 19 is a block diagram illustrating an embedded multi-media card (eMMC) according to an exemplary embodiment of the inventive concept.

Referring to FIG. 19, an eMMC 2000 includes one or more NAND flash memory devices 2100 and a controller 2200.

The NAND flash memory device 2100 may include the nonvolatile memory device 30 of FIG. 2. The NAND flash memory device 2100 may perform the dummy program operation on at least a portion of the boundary page and the clean pages before performing the erase operation on a first memory block when the sudden power off occurs in the first memory block during the normal program operation, as described above. As such, a deep erase may be prevented and performance may be enhanced.

The controller 2200 is connected with the NAND flash memory device 2100 via multiple channels. The controller 2200 includes one or more controller cores 2210, a host interface 2250, and a NAND interface 2260. The controller core 2210 controls an overall operation of the eMMC 2000. The host interface 2250 is an interface between the controller 2200 and a host HOST. The NAND interface 2260 is an interface between the NAND flash memory device 2100 and the controller 2200. According to exemplary embodiments of the inventive concept, the host interface 2250 may be a parallel interface (e.g., a MultiMediaCard (MMC) interface) or a serial interface (e.g., Ultra High Speed II (UHS-II), Universal Flash Storage (UFS), etc.).

The eMMC 2000 receives power supply voltages VCC and VCCq from the host HOST. For example, the power supply voltage VCC (e.g., about 3.3V) is supplied to the NAND flash memory device 2100 and the NAND interface 2260, and the power supply voltage VCCq (e.g., about 1.8V/3.3V) is supplied to the controller 2200. According to exemplary embodiments of the inventive concept, the NAND flash memory device 2100 may be optionally supplied with an external high voltage VPPx.

Figure 20:
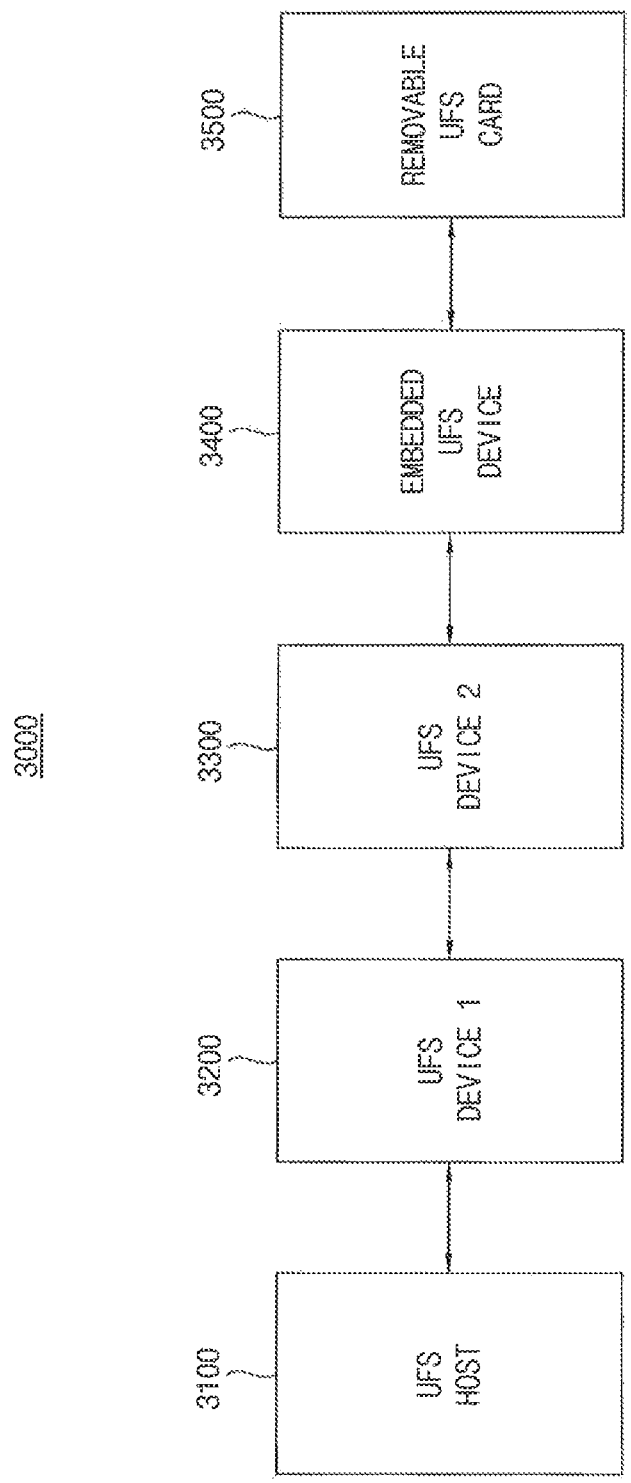
FIG. 20 is a block diagram illustrating a universal flash storage (UFS) according to an exemplary embodiment of the inventive concept.

FIG. 20 is a block diagram illustrating a universal flash storage (UFS) according to an exemplary embodiment of the inventive concept.

Referring to FIG. 20, a UFS system 3000 may include a UFS host 3100, UFS devices 3200 and 3300, an embedded UFS device 3400, and a removable UFS card 3500. The UFS host 3100 is an application processor of a mobile device. Each of the UFS host 3100, the UFS devices 3200 and 3300, the embedded UFS device 3400 and the removable UFS card 3500 communicate with external devices through the UFS protocol. At least one of the UFS devices 3200 and 3300, the embedded UFS device 3400, and the removable UFS card 3500 is implemented by the nonvolatile memory device 30 of FIG. 2. Therefore, at least one of the UFS devices 3200 and 3300, the embedded UFS device 3400, and the removable UFS card 3500 may perform the dummy program operation on at least a portion of the boundary page and the clean pages before performing the erase operation on a first memory block when the sudden power off occurs in the first memory block during the normal program operation, as described above. As such, a deep erase may be prevented and performance may be enhanced.

The embedded UFS device 3400 and the removable UFS card 3500 may communicate using protocols other than the UFS protocol. Additionally, the UFS host 3100 and the removable UFS card 3500 may communicate through various card protocols (e.g., USB flash drives (UFDs), MMC, secure digital (SD), mini SD, micro SD, etc.).

Figure 21:
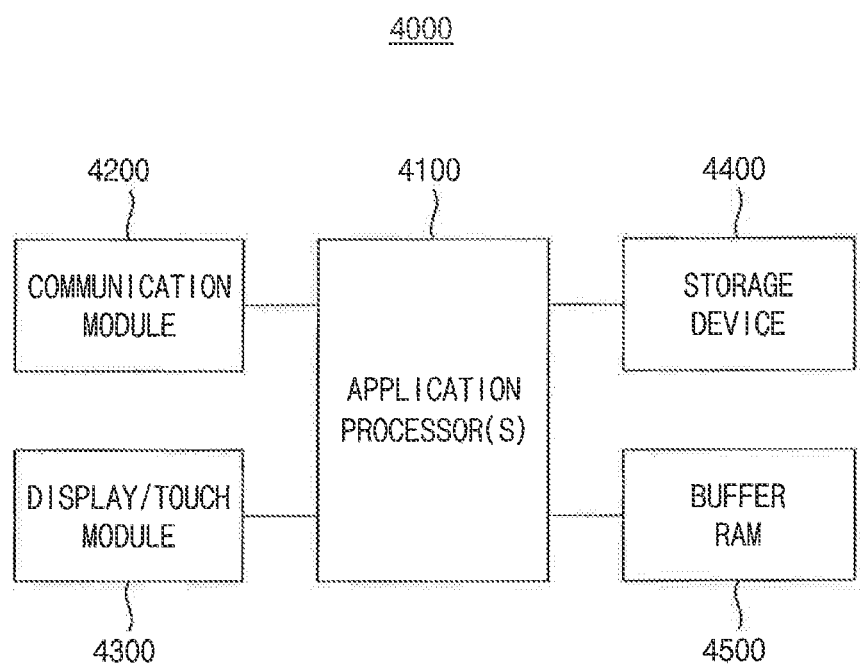
FIG. 21 is a block diagram illustrating a mobile device according to an exemplary embodiment of the inventive concept.

FIG. 21 is a block diagram illustrating a mobile device according to an exemplary embodiment of the inventive concept.

Referring to FIG. 21, a mobile device 4000 may include an application processor 4100, a communication module 4200, a display/touch module 4300, a storage device 4400, and a mobile RAM 4500.

The application processor 4100 controls operations of the mobile device 4000. The communication module 4200 performs wireless or wired communications with an external device. The display/touch module 4300 displays data processed by the application processor 4100 or receives data through a touch panel. The storage device 4400 stores user data. The storage device 4400 may be an eMMC, an SSD, a UFS device, etc. The storage device 4400 may include the nonvolatile memory device 30 of FIG. 2. The storage device 4400 may perform the dummy program operation on at least a portion of the boundary page and the clean pages before performing the erase operation on a first memory block when the sudden power off occurs in the first memory block during the normal program operation, as described above. As such, a deep erase may be prevented and performance may be enhanced.

The mobile RAM 4500 temporarily stores data used for processing operations of the mobile device 4000.

A memory device or a storage device according to an exemplary embodiment of the inventive concept may be packaged using various package types or package configurations, such as Package on Package (PoP), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline Integrated Circuit (SOIC), Shrink Small Outline Package (SSOP), Thin Small Outline (TSOP), System In Package (SIP), Multi Chip Package (MCP), Wafer-level Fabricated Package (WFP), Wafer-Level Processed Stack Package (WSP), or the like.

The present inventive concept may be applied to various devices and systems. For example, the present inventive concept may be applied to systems such as a mobile phone, a smart phone, a personal digital assistant (PDA), a portable multimedia player (PMP), a digital camera, a camcorder, a personal computer (PC), a server computer, a workstation, a laptop computer, a digital TV, a set-top box, a portable game console, a navigation system, etc.

While the inventive concept has been shown and described with reference to exemplary embodiments thereof, it will be apparent to those of ordinary skill in the art that various modifications in form and detail may be made thereto without materially departing from the spirit and scope of the present inventive concept as defined by the following claims.

What is claimed is:

1. A method of operating a storage device including at least one nonvolatile memory device and a memory controller configured to control the at least one nonvolatile memory device, the method comprising:
    searching for a boundary page of a first memory block among a plurality of memory blocks included in the at least one nonvolatile memory device;
    searching for at least one clean page, in which data is not written, of the first memory block;
    performing a dummy program operation on a portion of the boundary page and the at least one clean page; and
    performing an erase operation on the first memory block.

2. The method of claim 1, wherein the dummy program operation is performed in response to a sudden power-off information generated in response to a sudden power-off,
    wherein the sudden power-off is an event during which power supplied to the at least one nonvolatile memory device ceases.

3. The method of claim 1, wherein the boundary page is a page on which a normal program operation was being performed and the at least one clean page is a page on which the normal program operation was not being performed when a sudden power-off occurs, and
    wherein the sudden power-off is an event during which power supplied to the at least one nonvolatile memory device ceases.

4. The method of claim 3, wherein a time to perform the dummy program operation is shorter than a time to perform the normal program operation.

5. The method of claim 1, wherein the at least one clean page is a page disposed above the boundary page in a program operation direction, wherein the program operation direction is a direction in which program operations are performed.

6. The method of claim 1, wherein searching for the boundary page comprises:
    sequentially applying a boundary page read voltage to word-lines of the first memory block; and
    determining a first page of the first memory block to be the boundary page,
    wherein the first page has a number of memory cells having threshold voltages higher than the boundary page read voltage wherein the number of memory cells is greater than a reference value.

7. The method of claim 6, wherein
    the boundary page and the at least one clean page are included in a plurality of pages in the first memory block,
    the plurality of pages has a plurality of memory cells that correspond thereto,
    each of the plurality of memory cells stores single-bit data or multi-bit data, and
    the reference value varies according to a number of data bits stored in each of the plurality of memory cells.

8. The method of claim 1, wherein searching for the at least one clean page comprises:
    sequentially applying a clean page read voltage to word-lines of the first memory block; and
    determining a first page of the first memory block to be the clean page,
    wherein the first page has a number of memory cells having threshold voltages higher than the clean page read voltage wherein the number of memory cells is smaller than a reference value.

9. The method of claim 1, wherein the dummy program operation is performed by applying a one-shot pulse to word-lines coupled to the portion of the boundary page and the at least one clean page.

10. A method of operating a storage device including at least one nonvolatile memory device and a memory controller configured to control the at least one nonvolatile memory device, the method comprising:
    searching for an initial clean word-line, in which data is not written, among a first memory block of a plurality of memory blocks in the at least one nonvolatile memory device after a sudden power-off, wherein the sudden power-off is an event during which power supplied to the at least one nonvolatile memory device ceases;
    selectively performing a dummy program operation on a clean page; and
    performing an erase operation on the first memory block after the dummy program operation is completed,
    wherein the clean page is a page coupled to the initial clean word-line.

11. The method of claim 10, wherein the first memory block includes a plurality of cell strings coupled to a plurality of string selection lines, and the method further comprising:
    determining whether the clean page is a page coupled to a lowest word-line of the first memory block,
    wherein the lowest word-line is a first word-line in the memory block.

12. The method of claim 11, wherein when the clean page is the page coupled to the lowest word-line of the first memory block, the dummy program operation is sequentially performed on memory cells coupled to the string selection lines on a word-line-by-word-line basis starting from the lowest word-line.

13. The method of claim 11, wherein when the clean page is not the page coupled to the lowest word-line of the first memory block, the dummy program operation is sequentially performed on memory cells coupled to the string selection lines on a string selection line-by-string selection line basis.

14. The method of claim 10, wherein searching for the initial clean word-line comprises:
    sequentially applying a clean page read voltage to word-fines of the first memory block; and
    determining a first word-line of the first memory block to be the initial clean word-line,
    wherein the first word-line is coupled to a page that has a number of memory cells which are in an off-state wherein the number of memory cells is smaller than a reference value.

15. A storage device comprising:
    a memory controller including a dummy program determinator; and
    a nonvolatile memory device including a memory cell array,
    wherein the memory controller is configured to control the nonvolatile memory device, the memory cell array includes a plurality of memory blocks, the dummy program determinator searches for a boundary page among a plurality of pages of a first memory block among the plurality of memory blocks and determines whether to perform a dummy program operation on a portion of the boundary page and at least one clean page, and the dummy program operation is performed by applying a one-shot pulse to word-lines coupled to the portion of the boundary page and the at least one clean page.

16. The storage device of claim 15, wherein the dummy program determinator determines whether the nonvolatile memory device is suddenly powered off in response to sudden power-off information generated by the nonvolatile memory device, the dummy program determinator reads the sudden power-off information from the nonvolatile memory device, and the dummy program determinator searches for the boundary page in response to the sudden power-off information.

17. The storage device of claim 15, wherein when it is determined that the dummy program operation is to be performed, the memory controller transmits an address corresponding to the boundary page and dummy program data to the nonvolatile memory device.

18. The storage device of claim 15, wherein the plurality of pages of the first memory block correspond to a plurality of memory cells coupled to first to M-th word-lines and first to N-th string selection lines, wherein M is an integer greater than two and N is an integer greater than or equal to one, the first word-line and M-th word-line are dummy word-lines, the plurality of memory cells includes a sudden power-off memory cell, which is a memory cell upon which normal program operation is performed when the nonvolatile memory device is suddenly powered off, the boundary page, which corresponds to at least the sudden power-off memory cell, is coupled to a K-th word-line, K being an integer greater than one and less than M, the sudden power-off memory cell is coupled to the K-th word-line and an L-th string selection line, L being an integer between one and N, and the dummy program operation is performed on memory cells coupled to the dummy word-lines, memory cells coupled to the K-th word-line and L to N-th string selection lines, and memory cells coupled to (K+1)-th to (M−1)-th word-lines and first to N-th string selection lines.

19. The storage device of claim 15, wherein the nonvolatile memory device furthers comprises:

a voltage generator including a high voltage generator and a low voltage generator, wherein the high voltage generator generates a dummy program voltage for performing the dummy program operation, and the low voltage generator generates a boundary page read voltage for searching for the boundary page.

* * * * *